(12) United States Patent
Lee et al.

(10) Patent No.: US 11,564,321 B2
(45) Date of Patent: *Jan. 24, 2023

(54) DISPLAY DEVICE, AND METHOD AND APPARATUS FOR MANUFACTURING THE SAME

(71) Applicant: SAMSUNG DISPLAY CO., LTD., Yongin-si (KR)

(72) Inventors: Kyung-Su Lee, Yongin-si (KR); Kwan-Young Han, Yongin-si (KR); Jong-Hwan Kim, Yongin-si (KR); Yong-Youl Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/341,303

(22) Filed: Jun. 7, 2021

(65) Prior Publication Data
US 2021/0298185 A1    Sep. 23, 2021

Related U.S. Application Data

(63) Continuation of application No. 15/235,023, filed on Aug. 11, 2016, now Pat. No. 11,032,918, which is a
(Continued)

(30) Foreign Application Priority Data

Jun. 29, 2012   (KR) .................. 10-2012-0071375
Feb. 8, 2013    (KR) .................. 10-2013-0014650

(51) Int. Cl.
*G06F 1/16*    (2006.01)
*H05K 5/00*    (2006.01)
(Continued)

(52) U.S. Cl.
CPC ......... *H05K 5/0017* (2013.01); *G06F 1/1652* (2013.01); *H01L 51/5246* (2013.01);
(Continued)

(58) Field of Classification Search
CPC ............... G06F 1/1652; H01L 51/5246; G02F 1/133305; G09G 2380/02; G09F 9/301
See application file for complete search history.

(56) References Cited

U.S. PATENT DOCUMENTS 5,131,968 A    7/1992   Well et al.
7,045,944 B2   5/2006   Ushifusa et al.
(Continued)

FOREIGN PATENT DOCUMENTS

CN   1195407 A    10/1998
CN   1447175 A    10/2003
(Continued)

OTHER PUBLICATIONS

Abstract and partial English translation of relevant parts of JP 2007-326259 A dated Dec. 20, 2007, listed above (2 pages).
(Continued)

*Primary Examiner* — Adrian S Wilson
(74) *Attorney, Agent, or Firm* — Lewis Roca Rothgerber Christie LLP

(57) ABSTRACT

A display device, and a method and apparatus for manufacturing the display device, are provided. The display device includes a cover window including a curved portion, and a display panel smaller in at least one of length or width than the cover window and laminated on a flat portion of the cover window.

5 Claims, 13 Drawing Sheets

Related U.S. Application Data continuation of application No. 13/871,970, filed on Apr. 26, 2013, now Pat. No. 9,439,315.

(51) Int. Cl.
| | |
|---|---|
| *H05K 7/00* | (2006.01) |
| *H05K 13/02* | (2006.01) |
| *H04M 1/02* | (2006.01) |
| *H01L 51/52* | (2006.01) |
| *H05K 5/03* | (2006.01) |
| *G02F 1/1333* | (2006.01) |
| *H01L 27/32* | (2006.01) |

(52) U.S. Cl.
CPC ............ *H04M 1/0268* (2013.01); *H05K 5/03* (2013.01); *H05K 7/00* (2013.01); *H05K 13/022* (2013.01); *G02F 1/1333* (2013.01); *H01L 27/3244* (2013.01); *H01L 2251/5338* (2013.01); *Y10T 156/10* (2015.01); *Y10T 156/1744* (2015.01)

(56) References Cited

U.S. PATENT DOCUMENTS

| | | | |
|---|---|---|---|
| 7,300,084 | B2 | 11/2007 | Chae et al. |
| 7,554,254 | B2 | 6/2009 | Lee et al. |
| 8,094,442 | B2 | 1/2012 | Sugawara |
| 8,163,126 | B2 | 4/2012 | Harada et al. |
| 8,212,970 | B2 | 7/2012 | Nagata |
| 8,338,198 | B2 * | 12/2012 | Takayama ......... H01L 21/76251 438/626 |
| 8,421,708 | B2 | 4/2013 | Han |
| 8,773,848 | B2 | 7/2014 | Russell-Clarke et al. |
| 9,323,400 | B2 | 4/2016 | Kim et al. |
| 9,439,315 | B2 * | 9/2016 | Lee ........................ H05K 5/03 |
| 11,032,918 | B2 * | 6/2021 | Lee ........................ H05K 5/0017 |
| 11,032,924 | B2 * | 6/2021 | Lee ........................ H05K 7/00 |
| 2002/0027636 | A1 | 3/2002 | Yamada |
| 2002/0180712 | A1 | 12/2002 | Sato et al. |
| 2003/0184217 | A1 | 10/2003 | Yamazaki et al. |
| 2004/0135160 | A1 | 7/2004 | Cok |
| 2005/0259423 | A1 | 11/2005 | Heuser et al. |
| 2006/0216909 | A1 | 9/2006 | Yamazaki et al. |
| 2006/0273304 | A1 | 12/2006 | Cok |
| 2007/0194304 | A1 | 8/2007 | Zu et al. |
| 2008/0074022 | A1 * | 3/2008 | Wang .................... H01L 51/524 313/504 |
| 2008/0227507 | A1 | 9/2008 | Joo |
| 2009/0002930 | A1 | 1/2009 | Nakanishi et al. |
| 2009/0088041 | A1 | 4/2009 | Inoue et al. |
| 2009/0096965 | A1 | 4/2009 | Nagata |
| 2009/0277578 | A1 | 11/2009 | Sung et al. |
| 2010/0033661 | A1 | 2/2010 | Shinya et al. |
| 2010/0073593 | A1 | 3/2010 | Sasaki et al. |
| 2010/0090981 | A1 | 4/2010 | Park et al. |
| 2010/0103138 | A1 | 4/2010 | Huang et al. |
| 2010/0253902 | A1 | 10/2010 | Yamazaki et al. |
| 2010/0264817 | A1 * | 10/2010 | Bouten ................. G02F 1/1339 313/512 |
| 2010/0284132 | A1 | 11/2010 | Yi et al. |
| 2011/0019123 | A1 | 1/2011 | Prest et al. |
| 2011/0019129 | A1 | 1/2011 | Nishizawa et al. |
| 2011/0050657 | A1 | 3/2011 | Yamada |
| 2011/0068492 | A1 | 3/2011 | Chen et al. |
| 2011/0120619 | A1 | 5/2011 | Harada et al. |
| 2011/0146893 | A1 | 6/2011 | Marty et al. |
| 2011/0199348 | A1 | 8/2011 | Takatani et al. |
| 2011/0261002 | A1 | 10/2011 | Verthein |
| 2012/0051067 | A1 | 3/2012 | Murray |
| 2012/0055826 | A1 | 3/2012 | Nishimura |
| 2012/0081874 | A1 | 4/2012 | Wu et al. |
| 2012/0105340 | A1 | 5/2012 | Beom et al. |
| 2012/0111479 | A1 | 5/2012 | Sung et al. |
| 2012/0120023 | A1 | 5/2012 | Huang et al. |
| 2012/0218651 | A1 | 8/2012 | Onishi et al. |
| 2012/0236526 | A1 | 9/2012 | Weber |
| 2012/0242588 | A1 | 9/2012 | Myers et al. |
| 2012/0275024 | A1 | 11/2012 | Marzen et al. |
| 2012/0275097 | A1 | 11/2012 | Lee |
| 2013/0002133 | A1 | 1/2013 | Jin et al. |
| 2013/0002583 | A1 | 1/2013 | Jin et al. |
| 2013/0029075 | A1 | 1/2013 | Niiyama et al. |
| 2013/0034685 | A1 | 2/2013 | An et al. |
| 2013/0083496 | A1 | 4/2013 | Franklin et al. |
| 2013/0188366 | A1 * | 7/2013 | Russell-Clarke ....... B24B 7/241 65/36 |
| 2014/0002975 | A1 | 1/2014 | Lee et al. |
| 2014/0104762 | A1 | 4/2014 | Park |
| 2014/0140037 | A1 | 5/2014 | Cho |
| 2014/0233194 | A1 | 8/2014 | Hongo et al. |
| 2015/0293390 | A1 | 10/2015 | Tsunekawa |

FOREIGN PATENT DOCUMENTS

| | | |
|---|---|---|
| CN | 1704814 A | 12/2005 |
| CN | 101026182 A | 8/2007 |
| CN | 101086563 A | 12/2007 |
| CN | 101306620 A | 11/2008 |
| CN | 101308263 A | 11/2008 |
| CN | 101334547 A | 12/2008 |
| CN | 101399175 A | 4/2009 |
| CN | 101652804 A | 2/2010 |
| CN | 201811892 U | 4/2011 |
| CN | 102066110 A | 5/2011 |
| CN | 102119077 A | 7/2011 |
| CN | 102290429 A | 12/2011 |
| CN | 102402323 A | 4/2012 |
| CN | 203415180 U | 1/2014 |
| JP | 07-114347 | 5/1995 |
| JP | 2005-161528 | 6/2005 |
| JP | 2006-248651 | 9/2006 |
| JP | 2007-246881 A | 9/2007 |
| JP | 2007-326259 A | 12/2007 |
| JP | 2008-060376 | 3/2008 |
| JP | 4567941 B2 | 10/2010 |
| KR | 10-2006-0129848 A | 12/2006 |
| KR | 10-2008-0056823 A | 6/2008 |
| KR | 10-0864407 B1 | 10/2008 |
| KR | 10-2009-0057967 | 6/2009 |
| KR | 10-2010-0041450 | 4/2010 |
| KR | 10-2012-0029090 | 3/2012 |
| KR | 10-2012-0040783 A | 4/2012 |
| TW | 201017499 A | 5/2010 |
| TW | 201112199 A1 | 4/2011 |
| WO | WO 2011/010873 A2 | 1/2011 |
| WO | WO 2011/055504 A1 | 5/2011 |
| WO | WO 2011/148990 A1 | 12/2011 |
| WO | WO 2012/036389 A3 | 3/2012 |

OTHER PUBLICATIONS

European Search Report dated Oct. 28, 2013 issued in European Patent Application 13173931.0, 5 pages.

Huang, Jian-Ji, et al.; Lifetime Improvement of Organic Light Emitting Diodes using LiF Thin Film and UV Glue Encapsulation, Japanese Journal of Applied Physics, vol. 47, No. 7, 2008, pp. 5676-5680.

SIPO Office action dated Jan. 19, 2016, for corresponding Chinese Patent application 201410386628.X, (9 pages).

SIPO Office action dated Oct. 9, 2016, for corresponding Chinese Patent application 201310269434.7 (6 pages).

SIPO Office Action, with English translation, dated Feb. 28, 2017, for corresponding Chinese Patent Application No. 201410386628.X (25 pages).

Tangent (www.nnathopenref.conn) accessed Nov. 1, 2019.

TIPO Office Action dated Oct. 21, 2016, with English Translation, for corresponding Taiwanese Patent Application No. 102122915 (34 pages).

U.S. Office action dated Jul. 6, 2015, for cross reference U.S. Appl. No. 13/931,795 (21 pages).

(56) References Cited

OTHER PUBLICATIONS

U.S. Office action dated Jan. 15, 2016, for cross reference U.S. Appl. No. 13/931,795, (20 pages).
U.S. Office action dated Jul. 8, 2016, for cross reference U.S. Appl. No. 13/931,795 (25 pages).
U.S. Notice of Allowance dated May 6, 2016, for cross reference U.S. Appl. No. 13/871,970 (9 pages).
U.S. Office Action dated Jan. 4, 2017, issued in cross-reference U.S. Appl. No. 13/931,795 (17 pages).
U.S. Office Action dated Dec. 8, 2017, issued in U.S. Appl. No. 13/931,795 (20 pages).
U.S. Final Office Action dated Aug. 1, 2018, issued in U.S. Appl. No. 14/794,720, 19 pages.
U.S. Office Action dated Feb. 21, 2019, issued in U.S. Appl. No. 14/794,720 (20 pages).
U.S. Office Action dated Jun. 25, 2019, issued in U.S. Appl. No. 13/931,795, (22 pages).
U.S. Final Office Action dated Nov. 6, 2019, issued in U.S. Appl. No. 13/931,795 (23 pages).
Office Action issued in U.S. Appl. No. 14/794,720 by the USPTO, dated Dec. 20, 2019, 32 pages.
U.S. Office Action dated Jun. 2, 2020, issued in U.S. Appl. No. 13/931,795 (26 pages).
U.S. Office Action dated Oct. 16, 2020, issued in U.S. Appl. No. 16/828,898 (8 pages).
www.merriam-webster.com/dictionary/flat, accessed Jul. 24, 2018 (Year: 2018).
Xiang, Li Jian et al.; Progress of encapsulation technology of organic light emitting diodes, School of Optoelectronic Information, Papers of the Seventh China Academic Conference on Functional Materials and Application with English Abstract, dated Oct. 31, 2010, 8 pages.
U.S. Final Office Action dated Mar. 23, 2022, issued in U.S. Appl. No. 13/931,795 (29 pages).
U.S. Advisory Action dated May 27, 2022, issued in U.S. Appl. No. 13/931,795 (3 pages).
U.S. Notice of Allowance dated Aug. 4, 2022, issued in U.S. Appl. No. 13/931,795 (8 pages).
U.S. Notice of Allowance dated Aug. 18, 2022, issued in U.S. Appl. No. 14/794,720 (8 pages).
U.S. Notice of Allowance dated Nov. 30, 2022, issued in U.S. Appl. No. 14/794,720 (6 pages).

* cited by examiner

DISPLAY DEVICE, AND METHOD AND APPARATUS FOR MANUFACTURING THE SAME

CROSS-REFERENCE TO RELATED PATENT APPLICATIONS

This application is a continuation of U.S. patent application Ser. No. 15/235,023, filed Aug. 11, 2016, which is a continuation of U.S. patent application Ser. No. 13/871,970, filed Apr. 26, 2013, now U.S. Pat. No. 9,439,315, which claims priority to and the benefit of Korean Patent Application No. 10-2012-0071375, filed on Jun. 29, 2012 in the Korean Intellectual Property Office, and of Korean Patent Application No. 10-2013-0014650, filed on Feb. 8, 2013 in the Korean Intellectual Property Office, the entire contents of all of which are incorporated herein by reference.

BACKGROUND

1. Field

Aspects of embodiments of the present invention relate to a display device, and a method and apparatus for manufacturing the display device.

2. Description of the Related Art

Electronic devices based on portability are widely used. Portable electronic devices that have recently been widely used include small electronic devices such as mobile phones as well as tablet personal computers (PCs). In order to support various functions, portable electronic devices include a display device for providing visual information such as an image to a user. Recently, as sizes of components for driving display devices have decreased, the importance of display devices in electronic devices has increased. Accordingly, display devices (such as flexible display devices) that bend at a set angle (for example, a predetermined angle) have been developed.

In general, flexible display devices that may bend at a set angle may be manufactured using a flexible process, such as being flexibly manufactured. Since a flexible display device may be formed of a flexible material, the flexible display device may have any of various shapes. A flexible display device may be manufactured by forming a light-emitting unit on a substrate to form a display unit, and sealing the display unit by using an encapsulation unit, which may increase a lifetime of the display unit. The substrate may be formed of a flexible material, and the encapsulation unit may be formed, for example, as a substrate or a thin film. As designs of electronic devices have recently been diversified, demands for flexible display devices have increased.

SUMMARY

Embodiments of the present invention provide for a display device having a curved shape (for example, having an arc shape or a degree of curvature) that may enable efficient mass production, high reliability, and high quality. Further embodiments provide for a method and apparatus for manufacturing the display device.

In an exemplary embodiment of the present invention, a display device is provided. The display device includes a cover window including a curved portion, and a display panel smaller in at least one of length or width than the cover window and laminated on a flat portion of the cover window.

The display device may further include an adhesive layer between the display panel and the cover window.

The cover window may further include a curved portion extending from the flat portion.

The display panel may be laminated entirely on the flat portion.

The curved portion may include a plurality of curved portions.

The display panel may include a first display panel portion laminated on the flat portion, and a second display panel portion extending in a curved shape from the first display panel portion and laminated on the curved portion.

The display panel may be flexible.

According to another exemplary embodiment of the present invention, a method of manufacturing a display device is provided. The method includes: mounting a cover window including a curved portion to a first jig including a curved portion; mounting a display panel, to which an adhesive layer is applied, to a second jig that conforms to a surface of the first jig; and laminating the cover window to the display panel by moving one of the first jig or the second jig to another of the first jig or the second jig.

The display panel may contact a flat surface of the second jig.

The display panel may be bent along an outer surface of the second jig during the mounting of the display panel to the second jig.

The display panel may be smaller in at least one of length or width than the cover window.

The display panel and the adhesive layer may be flat during the mounting of the display panel to the second jig. The laminating of the cover window to the display panel may include partially curving the display panel and the adhesive layer by the moving of the one of the first jig or the second jig.

The one of the first jig or the second jig may be above the other of the first jig or the second jig, or the other of the first jig or the second jig may be above the one of the first jig or the second jig.

The mounting of the display panel may include fixing the display panel to the second jig.

The display panel may be flexible.

According to yet another exemplary embodiment of the present invention, an apparatus for manufacturing a display device is provided. The apparatus includes a first jig including a mount surface that is partially curved to conform to a surface of a cover window, a second jig including a surface conforming to the mount surface and configured to contact a display panel to which an adhesive layer is applied, and an actuator connected to one of the first jig or the second jig and configured to move the one of the first jig or the second jig.

The first jig may further include a first fixing unit for fixing the cover window to the mount surface, or the second jig may further include a second fixing unit for fixing the display panel to the surface conforming to the mount surface.

The first fixing unit or the second fixing unit may include an absorption unit and a driving unit for evacuating air from the absorption unit.

At least one of the first jig or the second jig may further include a cushion unit at an outer surface of the at least one of the first jig or the second jig.

The cushion unit may include a plurality of cushion units at respective ends of the second jig. A distance between the cushion units may be less than at least one of length or width of the display panel.

The apparatus may further include a clamping unit spaced from the second jig and configured to support the display panel to which the adhesive layer is applied.

The clamping unit may include a plurality of clamping units. A distance between the clamping units may be less than at least one of length or width of the display panel when the clamping units support the display panel.

The apparatus may further include a driving unit coupled to the clamping unit and configured to linearly move the clamping unit.

The driving unit may be further configured to linearly move the clamping unit in a vertical direction of the second jig.

The driving unit may be further configured to linearly move the clamping unit in a diagonal direction of the second jig.

At least one of the first jig or the second jig may further include a cushion unit at an outer surface of the at least one of the first jig or the second jig.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, the present invention will be described more fully with reference to the accompanying drawings, in which exemplary embodiments are shown. The present invention may, however, be embodied in many different forms and should not be construed as being limited to the embodiments set forth herein. These embodiments are provided to make this disclosure more thorough, and to help convey concepts of the invention to one of ordinary skill in the art. The terminology used herein is for describing particular embodiments only and is not intended to be limiting of the present invention.

As used herein, the term "and/or" includes any and all combinations of one or more of the associated listed items. Expressions such as "at least one of," when preceding a list of elements, modify the entire list of elements and do not modify the individual elements of the list. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It will be understood that, although the terms first, second, third, etc., may be used herein to describe various elements, these elements should not be limited by these terms. These terms are only used to distinguish one element from another element.

In the embodiments of the present invention, examples of display devices include various display devices. For example, examples of display devices include liquid crystal display devices and organic light-emitting display devices. However, for convenience of explanation, it will be assumed that the display devices are organic light-emitting display devices.

Figure 1:
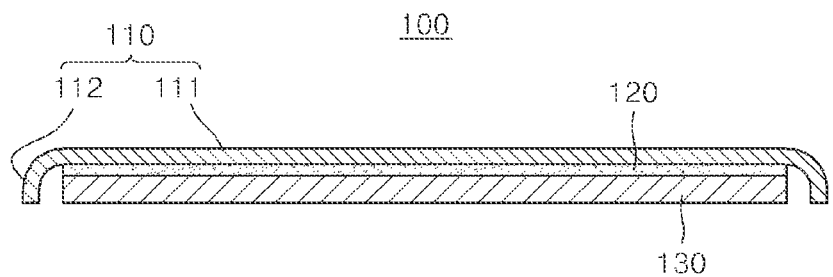
FIG. 1 is a cross-sectional view illustrating a display device according to an embodiment of the present invention.
Figure 2:
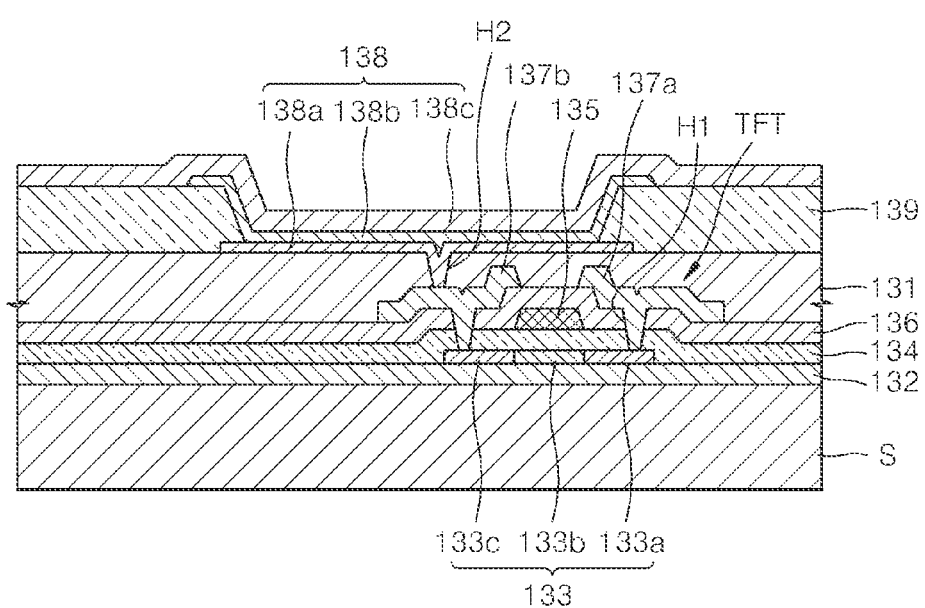
FIG. 2 is a cross-sectional view illustrating a display panel of the display device of FIG. 1.

FIG. 1 is a cross-sectional view illustrating a display device 100 according to an embodiment of the present invention. FIG. 2 is a cross-sectional view illustrating a display panel 130 of the display device 100 of FIG. 1.

Referring to FIGS. 1 and 2, the display device 100 includes a cover window 110, the display panel 130, and an adhesive layer 120. In FIG. 1, the cover window 110 is partially curved. That is, the cover window 110 has a flat portion (on which the display panel 130 is laminated, with the adhesive layer 120 therebetween) and at least one end of the flat portion is curved (e.g., a curved portion). As shown in FIG. 1, both ends of the flat portion are curved. As depicted, the cover window 110 includes a flat portion 111 and curved portions 112 that extend from the flat portion 111. The curved portions 112 are formed on both ends of the flat portion 111.

The display panel 130 may be flexible. As shown, the display panel 130 is smaller than the cover window 110. For example, the display panel 130 is shorter in at least one of length or width than the cover window 110 (due to the inward curvature of the cover window 110). For convenience of explanation it will be assumed that the display panel 130 is shorter in width than the cover window 110. For example, the display panel 130 may be laminated entirely on the flat portion 111 (and not on any of the curved portions 112). The display panel 130 includes a first substrate S and a light-emitting unit.

The display panel 130 may include an encapsulation unit formed on the light-emitting unit. The encapsulation unit may be formed as a thin film. In another embodiment, the encapsulation unit may include a second substrate instead of or in addition to a thin film. For convenience of explanation, however, it will be assumed that the encapsulation unit is formed as a thin film. In one embodiment, the display panel 130 may include a touch unit. The touch unit will be described below in further detail.

In FIG. 2, the light-emitting unit is formed on the first substrate S. The light-emitting unit includes a thin film transistor (TFT, in this case a driving TFT), a passivation film 131 formed to cover the TFT, and an organic light-emitting device, such as an organic light emitting diode (OLED) 138 formed on the passivation film 131. The first substrate S may be formed of a glass material, but the present invention is not limited thereto and, in other embodiments, the first substrate S may be formed of a plastic material or a metal material such as steel use stainless (SUS, or stainless steel) or titanium (Ti). In another embodiment, the first substrate S may include polyimide (PI). For convenience of explanation, it will be assumed that the first substrate S is formed of PI.

A buffer layer 132 formed of an organic compound and/or an inorganic compound such as SiOx (x≥1) or SiNx (x≥1) is formed on a top surface of the first substrate S. An active layer 133 having a set pattern (for example, a predetermined pattern) is formed on the buffer layer 132, and then is covered by a gate insulating layer 134. The active layer 133 includes a source region 133a and a drain region 133c, and a channel region 113b located between the source region 133a and the drain region 133c. The active layer 133 may be formed by forming an amorphous silicon film on the buffer layer 132, crystallizing the amorphous silicon film to form a polycrystalline silicon film, and patterning the polycrystalline silicon film. The source and drain regions 133a and 133c of the active layer 133 are doped with impurities according to a type of the TFT such as a driving TFT (for example, driving TFT in FIG. 2) or a switching TFT.

A gate electrode 135 corresponding to the active layer 133 and an interlayer insulating layer 136 covering the gate electrode 135 are formed on a top surface of the gate insulating layer 134. After contact holes (for example, via-hole H1) are formed in the interlayer insulating layer 136 and the gate insulating layer 134, a source electrode 137a and a drain electrode 137b are formed on the interlayer insulating layer 136 to respectively contact the source region 133a and the drain region 133c.

In some embodiments, a reflective film is formed at the same time (for example, in the same layer) as the source/drain electrodes 137a and 137b are formed as described above. Accordingly, each of the source/drain electrodes 137a and 137b may be formed of a material having high electrical conductivity and having a thickness great enough to reflect light. Each of the source/drain electrodes 137a and 137b may be formed of a metal material such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound or alloy thereof.

The passivation film 131 is formed on the TFT. Then a pixel electrode 138a of the OLED 138 is formed on the passivation film 131. The pixel electrode 138a contacts the drain electrode 137b of the TFT through a via-hole H2 formed in the passivation film 131. The passivation film 131 may be formed of an inorganic material and/or an organic material and have a single-layer structure or a multi-layer structure. As shown in FIG. 2, the passivation film 131 is formed as a planarization film having a flat top surface regardless of any roughness or irregularities of a bottom surface. The passivation film 131 may be formed of a transparent insulating material to achieve a resonance effect.

After the pixel electrode 138a is formed on the passivation film 131, a pixel-defining film 139 is formed of an organic material and/or an inorganic material to cover the pixel electrode 138a and the passivation film 131, and is opened to expose the pixel electrode 138a. An organic light-emitting layer 138b and a counter electrode 138c are formed on at least the pixel electrode 138a. The pixel electrode 138a functions as an anode and the counter electrode 138c functions as a cathode, or vice versa.

The pixel electrode 138a may be formed of a material having a high work function, such as indium tin oxide (ITO), indium zinc oxide (IZO), In$_2$O$_3$, or ZnO. The counter electrode 138c may be formed of a metal material having a low work function such as Ag, Mg, Al, Pt, Pd, Au, Ni, Nd, Ir, Cr, Li, Ca, or a compound thereof. For example, the counter electrode 138c may be formed of Mg, Ag, or Al to have a small thickness to function as a semi-transmissive reflective film. Accordingly, the counter electrode 138c may optically resonate to transmit light.

The pixel electrode 138a and the counter electrode 138c are insulated from each other by the organic light-emitting layer 138b, and apply voltages of different polarities to the organic light-emitting layer 138b for the organic light-emitting layer 138b to emit light. The organic light-emitting layer 138b may be formed of a low molecular weight organic material or a high molecular weight organic material.

If the organic light-emitting layer 138b is formed of a low molecular weight organic material, the light-emitting layer 138b may have a single-layer or multi-layer structure formed by stacking a hole injection layer (HIL), a hole transport layer (HTL), an emission layer (EML), an electron transport layer (ETL), and an electron injection layer (EIL). Examples of the low molecular weight organic material include copper phthalocyanine (CuPc), N,N'-Di(naphthalene-1-yl)-N,N'-diphenyl-benzidine (NPB), and tris-8-hydroxyquinoline and aluminum (Alq3). The low molecular weight organic material is formed by using vacuum deposition. The HIL, the HTL, the ETL, and the EIL may be commonly applied to red, green, and blue pixels. Accordingly, in some embodiments, the common layers may cover all pixels, like the counter electrode 138c.

If the organic light-emitting layer 138b is formed of a high molecular weight organic material, the organic light-emitting layer 138b may have a structure including an HTL and an EML. The HTL may be formed of poly(3,4-ethylenedioxythiophene) (PEDOT) and the EML may be formed of a high molecular weight organic material based on polyphenylene vinylene (PPV) or polyfluorene. The high molecular weight organic material may be formed by using screen printing or inkjet printing. The organic light-emitting layer 138b is not limited thereto, and various examples may be formed, applied, deposited, etc., as would be apparent to one of ordinary skill in the art.

The encapsulation unit may be formed as a thin film as described above. In further detail, the encapsulation unit may be formed by alternately stacking at least one organic layer and at least one inorganic layer. In some embodiments, a plurality of inorganic layers or a plurality of organic layers may be provided.

The organic layer may be formed of a polymer, and may have a single-layer structure or a multi-layer structure formed of one or more selected from the group including polyethylene terephthalate, polyimide, polycarbonate, epoxy, polyethylene, and polyacrylate. In one embodiment, the organic layer may be formed of polyacrylate. In further detail, the organic layer may be formed by polymerizing a monomer composition including a diacrylate-based monomer and a triacrylate-based monomer. A monoacrylate-based monomer may be further included in the monomer composition. In one embodiment, a well-known photoinitiator such as TPO may be further included in the monomer composition, but other embodiments of the present embodiment are not necessarily limited thereto.

The inorganic layer may have a single-layer structure or a multi-layer structure including a metal oxide or a metal nitride. In further detail, the inorganic layer may include one or more selected from the group including SiNx, $Al_2O_3$, $SiO_2$, and $TiO_2$. In one embodiment, an uppermost layer of the encapsulation unit that is exposed to the outside may be an inorganic layer to reduce or prevent moisture from penetrating into the organic light-emitting device.

The encapsulation unit may have at least one sandwich structure in which at least one organic layer is inserted between at least two inorganic layers. In another embodiment, the encapsulation unit may have at least one sandwich structure in which at least one inorganic layer is inserted between at least two organic layers.

The encapsulation unit may include a first inorganic layer, a first organic layer, and a second inorganic layer that are sequentially stacked on the display unit. In another embodiment, the encapsulation unit may include a first inorganic layer, a first organic layer, a second inorganic layer, a second organic layer, and a third inorganic layer that are sequentially stacked on the light-emitting unit. In another embodiment, the encapsulation unit may include a first inorganic layer, a first organic layer, a second inorganic layer, a second organic layer, a third inorganic layer, a third organic layer, and a fourth inorganic layer that are sequentially stacked on the light-emitting unit.

A halogenated metal layer including LiF may be further disposed between the light-emitting unit and the first inorganic layer. The halogenated metal layer may reduce or prevent the light-emitting unit from being damaged when the first inorganic layer is formed by using sputtering or plasma deposition.

The first organic layer may have an area smaller than that of the second inorganic layer, and the second organic layer may have an area smaller than that of the third inorganic layer. In one embodiment, the first organic layer may be completely covered by the second inorganic layer, and the second organic layer may be completely covered by the third inorganic layer.

The encapsulation unit may include a second substrate as described above. The second substrate may be formed similarly to the first substrate S. For example, the second substrate may be formed of a glass material, but like the first substrate S, the present invention is not limited thereto and, in other embodiments, the second substrate may be formed of a different material, such as a plastic material.

The display device 100 may include a touch unit formed on the display panel 130 as described above. The touch unit may be located between the display panel 130 and the adhesive layer 120. In other embodiments, the touch unit may be a panel positioned on the display panel 130. For example, the touch unit may be formed on the encapsulation unit. In another embodiment, the touch unit may be formed on the cover window 110 to have a panel shape or to have a pattern. As a method of forming a touch unit is well known to one of ordinary skill in the art, a detailed explanation thereof will not be given. In addition, for convenience of explanation, it will be assumed that a touch unit is not formed on the display panel 130.

The display device 100 includes the adhesive layer 120 that is located between the display panel 130 and the cover window 110. The adhesive layer 120 may be variously formed. For example, the adhesive layer 120 may include an adhesive film such as an optical clear adhesive (OCA) film or an adhesive material.

The adhesive layer 120 may have the same size as the display panel 130. In other embodiments, the adhesive layer 120 may be smaller than the display panel 130. The adhesive layer 120 is attached on one surface of the display panel 130 to laminate the display panel 130 to the cover window 110. For example, the adhesive layer 120 may be applied to the second substrate.

Accordingly, the display device 100 that is partially curved may be attached to various electronic devices, and may easily display images having various shapes. A method of manufacturing the display device 100 will now be described with reference to FIGS. 3 through 4C.

Figure 3:
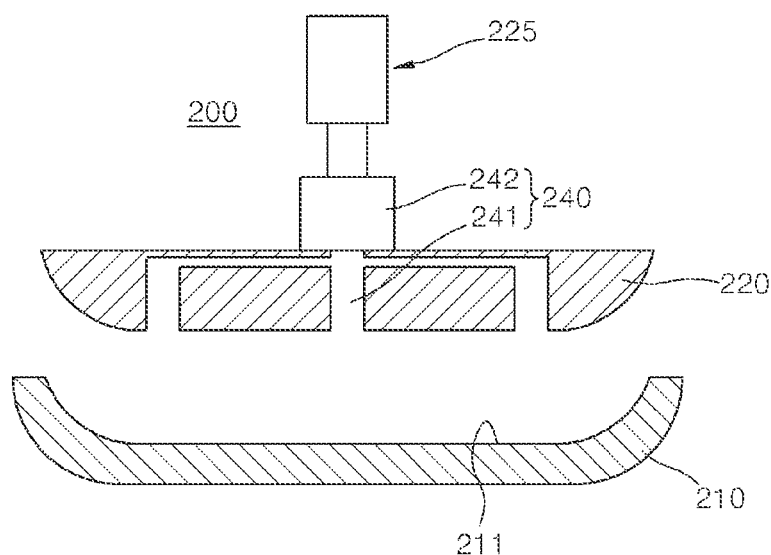
FIG. 3 is a cross-sectional view illustrating an apparatus for manufacturing the display device of FIG. 1 according to an embodiment of the present invention.
Figure 4A:
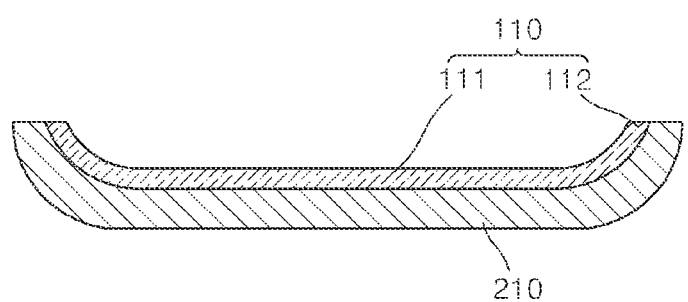
FIGS. 4A through 4C are cross-sectional views illustrating a method of manufacturing the display device of FIG. 1 according to an embodiment of the present invention.
Figure 4B:
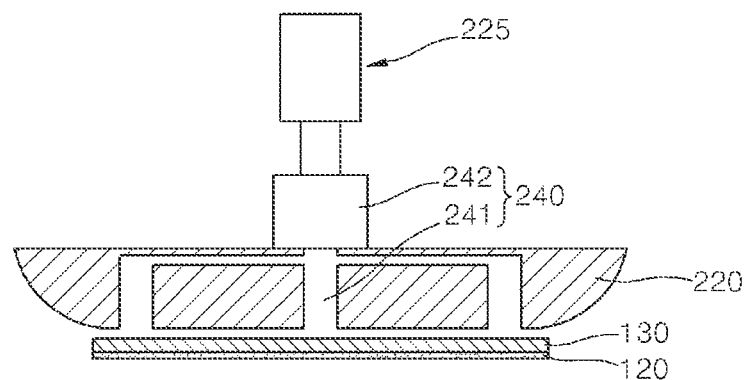
Figure 4C:
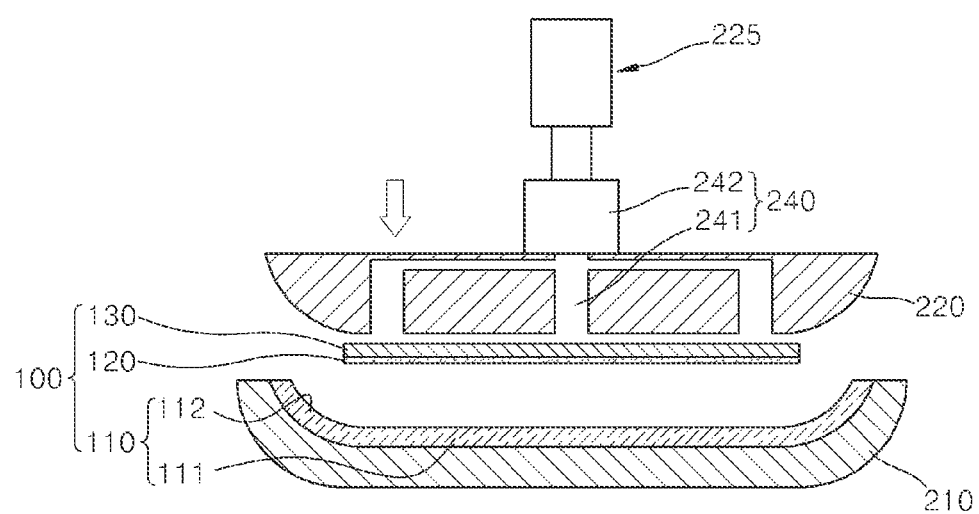

FIG. 3 is a cross-sectional view illustrating an apparatus 200 for manufacturing the display device 100 of FIG. 1 according to an embodiment of the present invention. FIGS. 4A through 4C are cross-sectional views illustrating a method of manufacturing the display device 100 of FIG. 1 according to an embodiment of the present invention. The same elements as those in FIG. 1 are denoted by the same reference numerals.

Referring to FIGS. 3 through 4C, the apparatus 200 includes a first jig 210 that is partially curved and has a mount surface 211 that conforms to one surface of the cover window 110. In FIGS. 3 through 4C, the first jig 210 has a shape similar to that of the cover window 110. That is, the mount surface 211 of the first jig 210 is curved. In addition, the mount surface 211 has a flat portion on which the flat portion 111 of the cover window is mounted and the mount surface 211 has curved portions on which the curved portions 112 of the cover window are mounted. For example, the mount surface 211 may be formed by being recessed in the first jig 210.

The apparatus 200 includes a second jig 220 that detachably couples to the first jig 210. One surface of the second jig 220 conforms to the mount surface 211. In FIGS. 3 through 4C, one surface of the second jig 220 is curved to conform to the mount surface 211 that is curved. That is, the second jig 220 is curved such that the second jig 220 protrudes toward the first jig 210. The display panel 130 is mounted on the flat surface of the second jig 220.

The apparatus 200 may include an actuator (such as second actuator 225) that is connected to at least one of the first jig 210 or the second jig 220, and that moves the corresponding at least one of the first jig 210 or the second jig 220. The actuator may include a first actuator that moves the first jig 210 and the second actuator 225 that moves the second jig 220. The first actuator and the second actuator 225 may be formed similarly. For convenience of explanation, it will be assumed that the second actuator 225 is provided.

The second actuator 225 may include any of various devices. For example, the second actuator 225 may include a cylinder that operates by air pressure or oil pressure to move the second jig 220. In other embodiments, the second actuator 225 may include a motor that operates by electricity to move the second jig 220. For convenience of explanation, it will be assumed that the second actuator 225 includes a cylinder.

The apparatus 200 includes a fixing unit (for example, second fixing unit 240) that prevents or helps prevent the cover window 110 mounted on the first jig 210 from moving, or the display panel 130 and the adhesive layer 120 mounted on the second jig 220 from separating from the second jig 220. The fixing unit includes an absorption unit (for example, second absorption unit 241) that is formed on at least one of the first jig 210 or the second jig 220. In addition, the fixing unit includes a driving unit (for example, second driving unit 242) that absorbs (for example, vacuums or evacuates) air from the absorption unit. The fixing unit is not limited thereto and, in other embodiments, may be formed in other various ways as would be apparent to one of ordinary skill in the art. For example, the fixing unit may be a separate frame that is formed on the first jig 210 or the second jig 220. As another example, the fixing unit may be an adhesive member having an adhesive force.

The fixing unit may include a first fixing unit that is provided on the first jig 210, and includes a second fixing unit 240 that is provided on the second jig 220. The first fixing unit and the second fixing unit 240 may be formed similarly. For example, the first fixing unit and the second fixing unit 240 may fix the cover window 110 and the display panel 130 by using air. In other embodiments, the first fixing unit and the second fixing unit 240 may fix the cover window 110 and the display panel 130 by using a separate frame. However, for convenience of explanation, it will be assumed that only the second fixing unit 240 is used and the display panel 130 is fixed by using air.

Accordingly, the apparatus 200 may rapidly and easily manufacture the display device 100 having a curved shape and a simple structure. In addition, since the apparatus 200 may accurately laminate the cover window 110 having a curved shape to the display panel 130, a defect rate may be reduced or minimized. A method of manufacturing the display device 100 by using the apparatus 200 will now be described with reference to FIGS. 4A through 4C.

In order to manufacture the display device 100, the cover window 110 is first fabricated. The cover window 110 may include any of various materials. For example, the cover window 110 may be formed of a glass material or a plastic material. The cover window 110 is not limited thereto and, in other embodiments, may include any material as long as the cover window 110 is partially curved or capable of being partially curved.

After the cover window 110 is fabricated, it may be flat, in which case the curved portions 112 may be formed by bending both ends of the cover window 110. For example, the curved portions 112 may be bent from the flat portion 111. In FIGS. 4A and 4C, the curved portions 112 extend from the flat portion 111 as described above, and each has an arc shape having a set radius (for example, a predetermined radius) or degree of curvature. In other embodiments, each of the curved portions 112 may have, for example, an oval shape instead of the arc shape.

The display panel 130 may be manufactured before, during, or after the cover window 110 is manufactured. A method of manufacturing the display panel 130 may be substantially the same as a method of manufacturing a general display panel (as would be apparent to one of ordinary skill in the art) and thus, a further detailed explanation thereof will not be given.

Once the display panel 130 is prepared, the adhesive layer 120 is attached on one surface of the display panel 130. For example, the adhesive layer 120 may be attached on the second substrate (or other encapsulation unit) as described above. The adhesive layer 120 may, for example, be attached as a film to the second substrate, or be applied as a material to the second substrate. However, for convenience of explanation, it will be assumed that the adhesive layer 120 is formed as a film.

After the adhesive layer 120 is attached to the display panel 130, the cover window 110 and the display panel 130 are respectively mounted on the first jig 210 and the second jig 220. That is, the cover window 110 is mounted on the first jig 210, and the display panel 130 is mounted on the second jig 220. The first jig 210 may be below the second jig 220 (for example, in a gravity direction).

Next, the distance between the first jig 210 and the second jig 220 is decreased. For example, the first jig 210 may move toward the second jig 220, or the second jig 220 may move toward the first jig 210. In other embodiments, both the first jig 210 and the second jig 220 may move closer to each other. However, for convenience of explanation, it will be assumed that the second jig 220 moves.

One surface of the first jig 210 is curved to conform (for example, closely attach) to one surface of the cover window 110. In FIGS. 4A and 4C, the surface of the first jig 210 is curved by being recessed. In addition, the display panel 130 is mounted on one surface of the second jig 220. The second fixing unit 240 fixes the display panel 130 to the surface of the second jig 220.

In FIGS. 4B and 4C, when the display panel 130 is mounted on the second jig 220, a second absorption unit 241 contacts, adheres, or is otherwise attached or fixed to one surface of the display panel 130. The second absorption unit 241 is partially exposed through an outer surface of the second jig 220. When the display panel 130 is positioned in this manner, the second driving unit 242 absorbs air from the second absorption unit 241 (for example, by creating a partial vacuum or a pressure difference). Since the display panel 130 closes (for example, occludes) all or a portion of the second absorption unit 241, and air in the second absorption unit 241 is continuously absorbed (for example, vacuumed or evacuated), the second absorption unit 241 is in an almost vacuum state. When the second driving unit 242 operates as described above, the display panel 130 attached to the second jig 220 is not separated from the second jig 220 due to the pressure difference.

In FIGS. 3 through 4C, a plurality of second absorption units 241 is provided. The second absorption units 241 are exposed or partially exposed through an outer surface of the second jig 220 as described above and are spaced apart from one another by a set interval (for example, a predetermined interval, such as evenly spaced).

When the cover window 110, the adhesive layer 120, and the display panel 130 are prepared as described above, the second jig 220 is moved toward the first jig 210 by driving the second actuator 225. For example, the second actuator 225 may be programmed to operate for a set period of time (for example, a predetermined period of time). When the second actuator 225 operates in this manner, the second jig 220 approaches the first jig 210. When the second jig 220 is continuously moved toward the first jig 210, the adhesive layer 120 contacts the cover window 110.

In FIG. 4C, the adhesive layer 120 and the display panel 130 may be the same size as the flat portion 111. Accordingly, when the second jig 220 is moved toward the first jig 210, the adhesive layer 120 contacts one surface of the flat portion 111. When the second actuator 225 continuously operates, the adhesive layer 120 contacting the flat portion 111 is compressed against the flat portion 111. Thus, the display panel 130 and the cover window 110 may be attached to each other through lamination.

Accordingly, the method may rapidly and accurately manufacture the display device 100 having a curved shape. Since the method accurately laminates the cover window 110 having a curved shape to the display panel 130, a defect rate may be reduced or minimized, and product quality may be improved.

Figure 5:
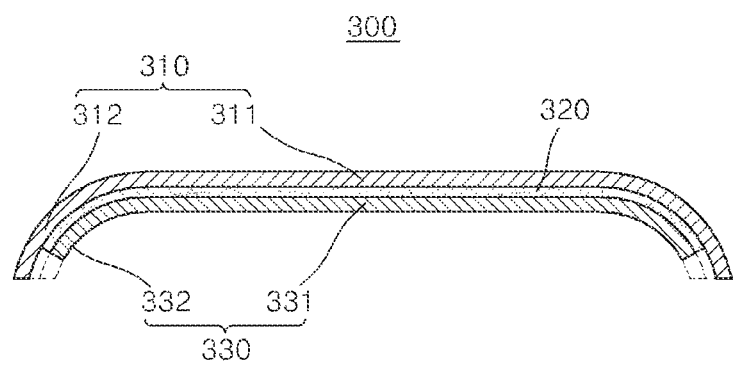
FIG. 5 is a cross-sectional view illustrating a display device according to another embodiment of the present invention.

FIG. 5 is a cross-sectional view illustrating a display device 300 according to another embodiment of the present invention.

Referring to FIG. 5, the display device 300 includes a cover window 310, a display panel 330, and an adhesive layer 320. The cover window 310 includes a flat portion 311 and curved portions 312. The cover window 310 and the adhesive layer 320 are substantially the same as the cover window 110 and adhesive layer 120 of FIG. 1 and thus, a detailed explanation thereof will not be repeated.

The display panel 330 includes a first display panel portion 331 that is laminated on the flat portion 311. In addition, the display panel 330 includes second display panel portions 332 that extend from the first display panel portion 331 and are laminated or partially laminated on the curved portions 312. The second display panel portions 332 extend in a curved shape from the first display panel portion 331. Accordingly, since the display device 300 includes the cover window 310 that is curved and the display device 300 displays a flat portion and a curved portion, a larger or maximum active area may be obtained. Further, due to the inward curvature of the cover window 310, the display panel 330 may be smaller in at least one of length or width than the cover window 310. In addition, the display device 300 that is partially curved may be attached to various electronic devices, and may easily display images having various shapes. For convenience of explanation, however, it will be assumed that the display panel 330 is shorter in width than the cover window 310.

A method of manufacturing the display device 300 will now be described with reference to FIGS. 6 through 7C.

Figure 6:
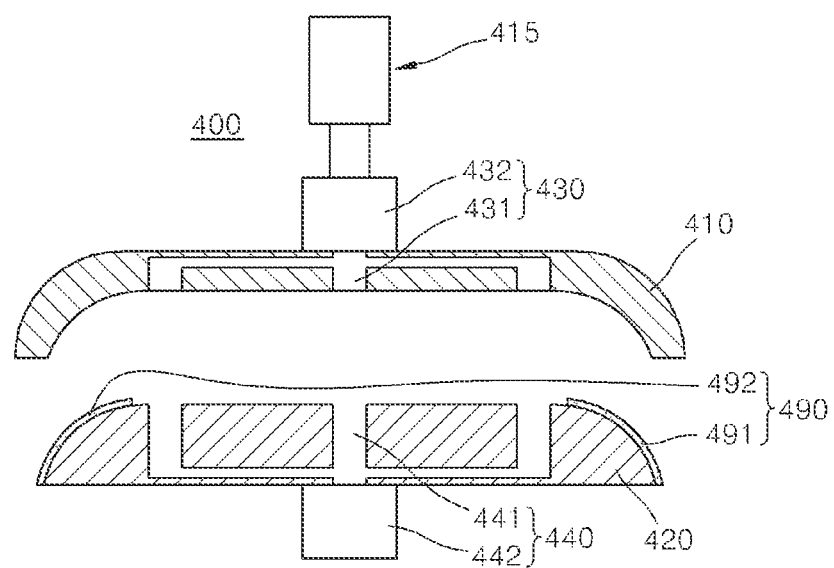
FIG. 6 is a cross-sectional view illustrating an apparatus for manufacturing the display device of FIG. 5 according to an embodiment of the present invention.
Figure 7A:
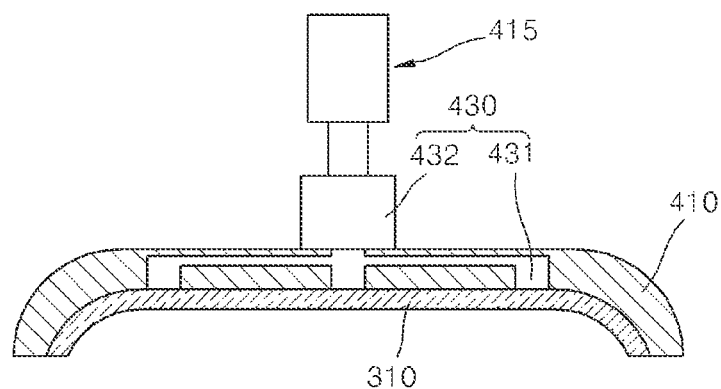
FIGS. 7A through 7C are cross-sectional views illustrating a method of manufacturing the display device of FIG. 5 according to an embodiment of the present invention.
Figure 7B:
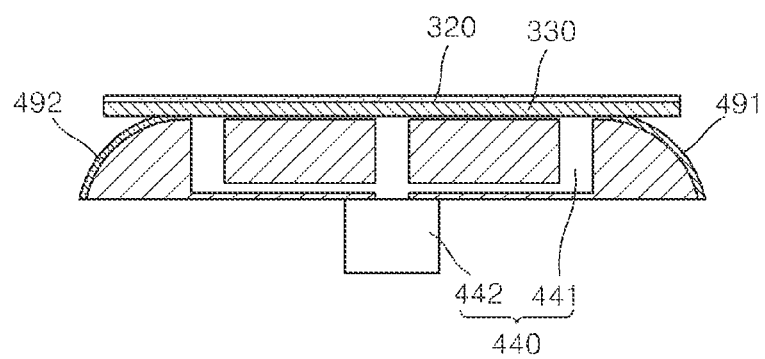

FIG. 6 is a cross-sectional view illustrating an apparatus 400 for manufacturing the display device 300 of FIG. 5 according to an embodiment of the present invention. FIGS. 7A through 7C are cross-sectional views illustrating a method of manufacturing the display device 300 of FIG. 5 according to an embodiment of the present invention. The same members as those of FIG. 5 are denoted by the same reference numerals.

Figure 7C:
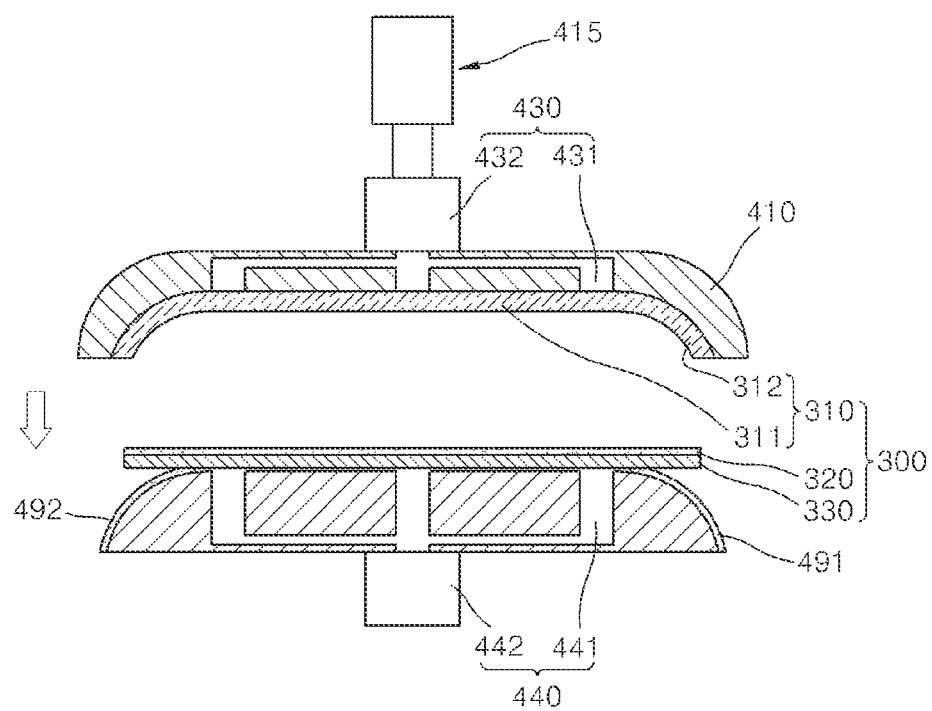

Referring to FIGS. 6 through 7C, the apparatus 400 includes a first jig 410, a second jig 420, an actuator (such as first actuator 415), and a fixing unit (for example, first fixing unit 430 and second fixing unit 440). The first jig 410, the second jig 420, the actuator, and the fixing unit are similar to the first jig 210, the second jig 220, the actuator (for example, the second actuator 225), and the fixing unit (for example, second fixing unit 240), respectively, as described above and thus, a detailed explanation thereof will not be repeated.

The actuator may include the first actuator 415 and a second actuator, and the fixing unit includes the first fixing unit 430 and the second fixing unit 440. The first actuator 415, the second actuator, the first fixing unit 430, and the second fixing unit 440 are substantially the same as the first actuator, the second actuator 225, the first fixing unit, and the second fixing unit 240, respectively, as described above and thus, a detailed explanation thereof will not be repeated. However, it will be assumed that the actuator including only the first actuator 415 operates.

The apparatus 400 may include a cushion unit 490 provided on or a part of at least one of the first jig 410 or the second jig 420. In this embodiment, a thickness of the cushion unit 490 may be greater than or equal to 0.5 mm and less than or equal to 3 mm. For convenience of explanation, however, it will be assumed that the cushion unit 490 is part of a surface of the second jig 420. In FIGS. 6 through 7C, a plurality of cushion units 490 are part of respective end portions of the second jig 420 to face the first jig 410. The cushion units 490 include a first cushion unit 491 and a second cushion unit 492 that are part of a surface of the second jig 420 and spaced apart by a set interval (for example, a predetermined interval) from each other. The distance between the first cushion unit 491 and the second cushion unit 492 is less than at least one of length or width of the display panel 330. For convenience of explanation, however, it will be assumed that the distance between the first cushion unit 491 and the second cushion unit 492 is less than a width of the display panel 330. The cushion units 490 support the display panel 330 and help prevent air bubbles from being formed between the display panel 330 and the curved portions 312 when the second jig 420 and the first jig 410 are compressed against each other with the display panel 330 and the cover unit therebetween.

Accordingly, the apparatus 400 may rapidly and easily manufacture the display device 300 having a curved shape and a simple structure. In addition, since the apparatus 400 may accurately laminate the cover window 310 having a curved shape to the display panel 330, a defect rate may be reduced or minimized. Further, since the apparatus 400 (such as the second jig 420) includes the cushion unit 490, a defect rate that may increase during lamination of the display panel 330 to the cover window 310 on the curved portions 312 may be reduced.

A method of manufacturing the display device 300 will now be described with reference to FIGS. 6 through 7C.

A method of manufacturing the display device 300 by using the apparatus 400 is similar to that described above. For example, the cover window 310 and the display panel 330 may be manufactured as described above and may be mounted on the first jig 410 and the second jig 420, respectively, (see FIG. 7A). Next, the first fixing unit 430 and the second fixing unit 440 respectively fix the cover window 310 and the display panel 330 to the first jig 410 and the second jig 420. When a first driving unit 432 operates, a first absorption unit 431 is maintained in a vacuum (or near vacuum) state. Likewise, when a second driving unit 442 operates, a second absorption unit 441 is maintained in a vacuum (or near vacuum) state. Accordingly, the cover window 310 and the display panel 330 are fixed to the first jig 410 and the second jig 420, respectively.

In FIGS. 6 through 7C, the first jig 410 is higher than the second jig 420 (for example, in a gravity direction). At least one of the first jig 410 or the second jig 420 then moves towards the other. For example, the first jig 410 may move toward the second jig 420, or the second jig 420 may move toward the first jig 410. In other embodiments, both the first jig 410 and the second jig 420 move closer to each other. However, for convenience of explanation, it will be assumed that the first jig 410 moves toward the second jig 420. When the first jig 410 moves toward the second jig 420, the first actuator 415 operates. When the first actuator 415 continuously operates, a curved surface of the cover window 310 contacts the adhesive layer 320.

At first, the display panel 330 and the adhesive layer 320 may be flat against the second jig 420. Then, when the adhesive layer 320 and the cover window 310 contact each other, both ends of the display panel 330 and the adhesive layer 320 may be curved (for example, through contact with the cover window 310 that is curved). Next, a first display panel portion 331 (that is flat) and second display panel portions 332 (that are curved) of the display panel 330 are formed. Accordingly, the first display panel portion 331 and the second display panel portions 332 are formed when the display panel 330 is adhered to the flat portion 311 and the curved portions 312. The cover window 310 may be attached to the display panel 330 through lamination as the first actuator 415 operates as described above (see FIG. 7C). In other embodiments, the display panel 330 and the adhesive layer 320 may be bent along an outer surface of the second jig 420 when the display panel 330 and the adhesive layer 320 are mounted on the second jig 420.

Accordingly, the method may rapidly and accurately manufacture the display device 300 having a curved shape. Since the method accurately laminates the cover window 310 having a curved shape to the display panel 330, a defect rate may be reduced or minimized. In addition, since the method removes air bubbles that may be formed after the display panel 330 and the curved portions 312 are compressed, product quality may be improved.

Figure 8:
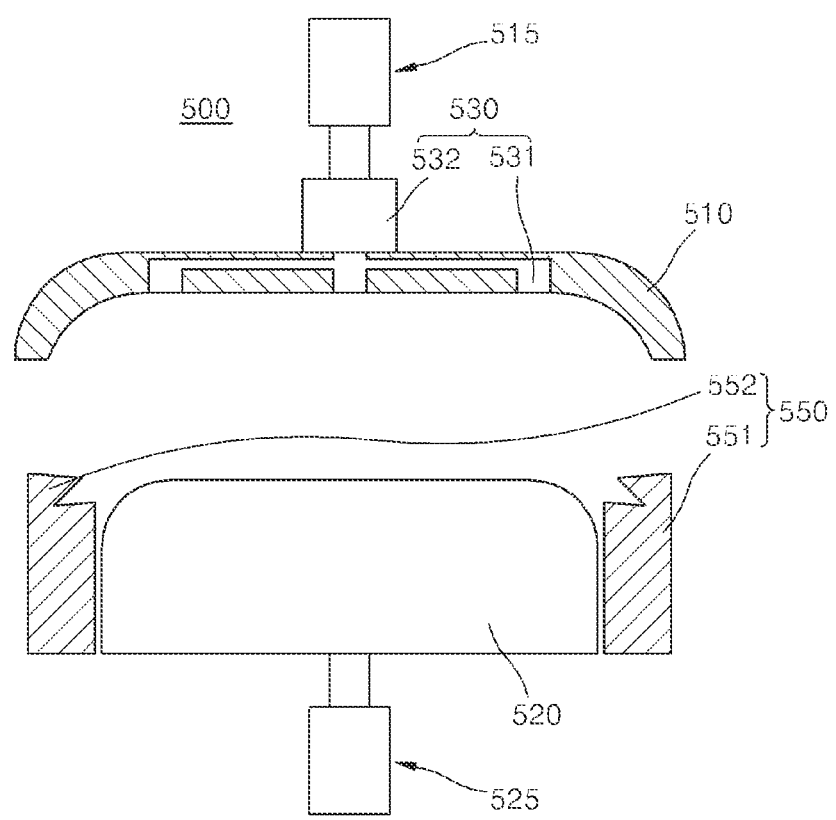
FIG. 8 is a cross-sectional view illustrating an apparatus for manufacturing the display device of FIG. 5 according to another embodiment of the present invention.
Figure 9A:
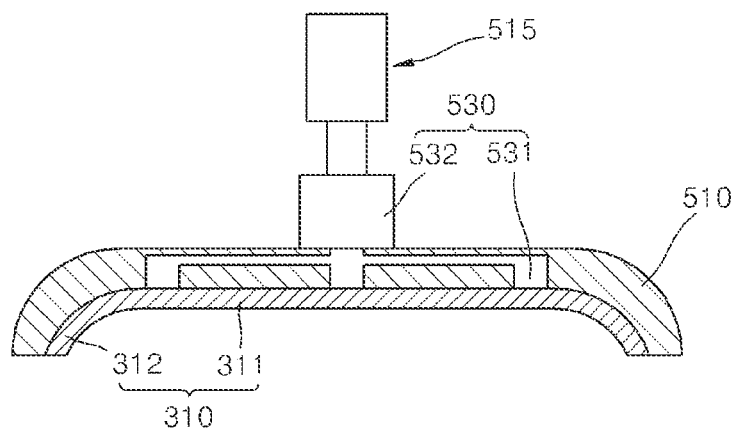
FIGS. 9A through 9C are cross-sectional views illustrating a method of manufacturing the display device of FIG. 5 according to another embodiment of the present invention.
Figure 9B:
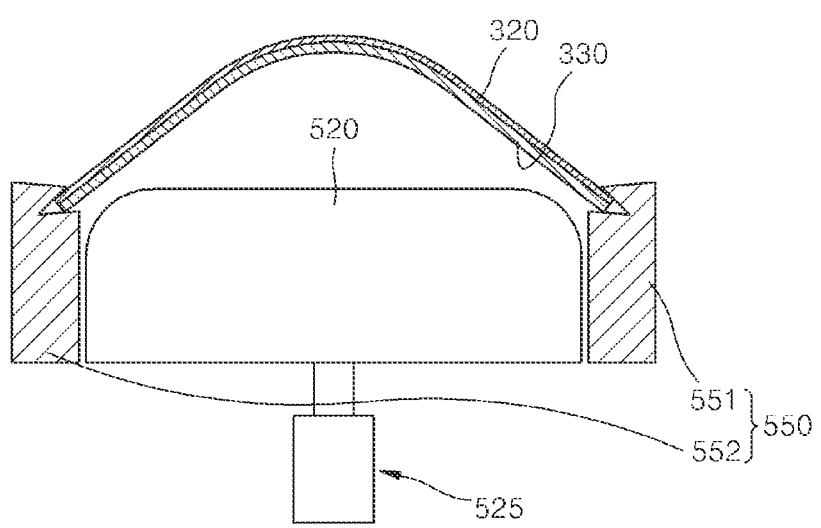
Figure 9C:
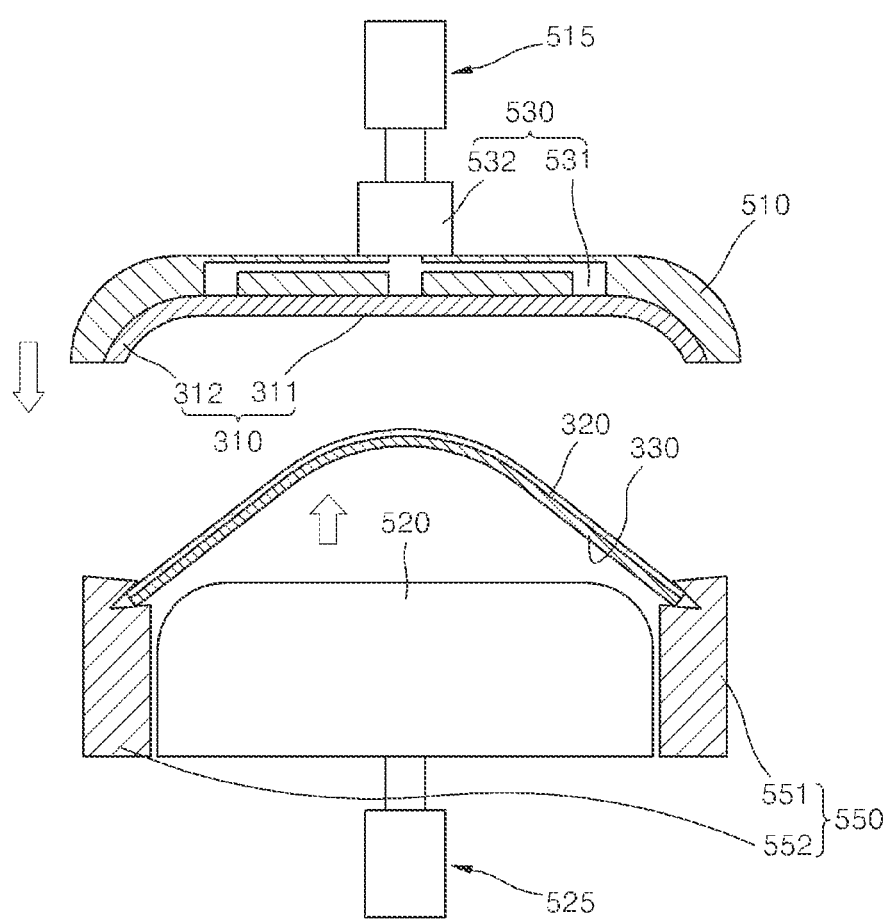

FIG. 8 is a cross-sectional view illustrating an apparatus 500 for manufacturing the display device 300 of FIG. 5 according to another embodiment of the present invention. FIGS. 9A through 9C are cross-sectional views illustrating a method of manufacturing the display device 300 of FIG. 5 according to another embodiment of the present invention.

Referring to FIGS. 8 through 9C, the apparatus 500 includes a first jig 510, a second jig 520, an actuator (such as first actuator 515 and second actuator 525), and a fixing unit (for example, first fixing unit 530). The first jig 510, the second jig 520, the actuator, and the fixing unit are substantially the same as those described above and thus, a detailed explanation thereof will not be repeated. The actuator may include the first actuator 515 and the second actuator 525, and the fixing unit includes the first fixing unit 530 (including first absorption unit 531 and first driving unit 532). The first actuator 515, the second actuator 525, and the first fixing unit 530 are substantially the same as those described above and thus, a detailed explanation thereof will not be repeated.

The apparatus 500 includes a clamping unit 550 that is spaced apart by a set interval (for example, a predetermined interval) from the second jig 520, and supports the display panel 330 to which the adhesive layer 320 is applied. In other embodiments, the clamping unit 550 may be spaced apart by a set interval (for example, a predetermined interval) from the first jig 510, and supports the cover window 310. For convenience of explanation, however, it will be assumed that the clamping unit 550 is disposed adjacent to the second jig 520.

The clamping unit 550 supports one or more ends of the display panel 330 and the adhesive layer 320 when they are inserted into the clamping unit 550. In FIGS. 8 through 9C, a plurality of clamping units 550 are provided, where a distance between the clamping units 550 is less than at least one of length or width of the display panel 330 when the clamping units 550 are fixing the display panel 330. Particularly, the clamping units 550 are placed at both ends of the cover window 310 in the direction of the at least one of width or length of the cover window 310. For convenience of explanation, however, it will be assumed that a plurality of clamping units 550 are provided, where a distance between the clamping units 550 is less than width of the display panel 330 when the clamping units 550 are fixing the display panel 330 below in further detail.

In FIGS. 8 through 9C, the clamping units 550 face respective side surfaces of the first jig 510, and fix respective ends of the display panel 330 and the adhesive layer 320. The clamping units 550 include a first clamping unit 551 and a second clamping unit 552 that are spaced apart by a set interval (for example, a predetermined interval) from each other.

Accordingly, the apparatus 500 may rapidly and easily manufacture the display device 300 having a curved shape and a simple structure. In addition, since the apparatus 500 may accurately laminate the cover window 310 having a curved shape to the display panel 330, a defect rate may be reduced or minimized. Further, since the apparatus 500 includes the clamping unit 550 to accurately align the display panel 330 and the cover window 310, working efficiency may be improved.

A method of manufacturing the display device 300 by using the apparatus 500 will now be described with reference to FIGS. 9A through 9C.

First, the cover window 310 is formed, the display panel 330 is formed, and then the adhesive layer 320 is attached on the display panel 330. The cover window 310 may be mounted on the first jig 510 as described above (see FIG. 9A). Next, respective ends of the display panel 330 on which the adhesive layer 320 is attached are fixed to the first clamping unit 551 and the second clamping unit 552. For example, the respective ends of the display panel 330 may be fixed by being inserted into insertion grooves formed in the first clamping unit 551 and the second clamping unit 552.

Once the display panel 330 and the adhesive layer 320 are fixed in this manner, middle portions of the display panel 330 and the adhesive layer 320 are curved upward (for example, with respect to a gravity direction). As shown in FIGS. 9B and 9C, since a distance between the first clamping unit 551 and the second clamping unit 552 is less than a width of the display panel 330, the middle portions protrude toward the first jig 510. When the display panel 330 and the adhesive layer 320 are fixed, the display panel 330, the adhesive layer 320, and the cover window 310 may be compressed by moving at least one of the first jig 510 or the second jig 520. For convenience of explanation, it will be assumed that the display panel 330, the adhesive layer 320, and the cover window 310 are compressed by moving both the first jig 510 and the second jig 520.

When the first jig 510 and the second jig 520 move, the first actuator 515 and the second actuator 525 may operate to move the first jig 510 and the second jig 520 closer to each other. The middle portions of the display panel 330 and the adhesive layer 320 (which are curved downward) then contact the cover window 310. For example, the middle portions of the display panel 330 and the adhesive layer 320 may first contact a portion of the flat portion 311. When the first jig 510 and the second jig 520 continuously move, the display panel 330 and the adhesive layer 320 are adhered to the cover window 310 from the flat portion 311 as the first contacting portion to the curved portions 312. That is, the display panel 330, the adhesive layer 320, and the cover window 310 contact in an order from the flat portion 311 to the curved portions 312.

At some point (for example, after the adhesive layer 320 contacts the flat portion 311), the second jig 520 may contact the display panel 330, the display panel 330 may detach from the clamping unit 550, and the first jig 510 and the second jig 520 may move closer to each other to further laminate the display panel 330 to the cover window 310.

Accordingly, the method may rapidly and accurately manufacture the display device 300 having a curved shape. In addition, since the method may accurately laminate the cover window 310 having a curved shape to the display panel 330, a defect rate may be reduced or minimized. Further, since the method removes air bubbles that may be formed after the display panel 330 and the curved portions 312 are compressed, product quality may be improved.

According to embodiments of the present invention, since a cover window that is partially curved and a display panel are rapidly and accurately laminated to each other, mass production, high reliability, and high quality may be achieved. In addition, since a display device may be manufactured rapidly, manufacturing time and costs may be reduced.

Figure 10:
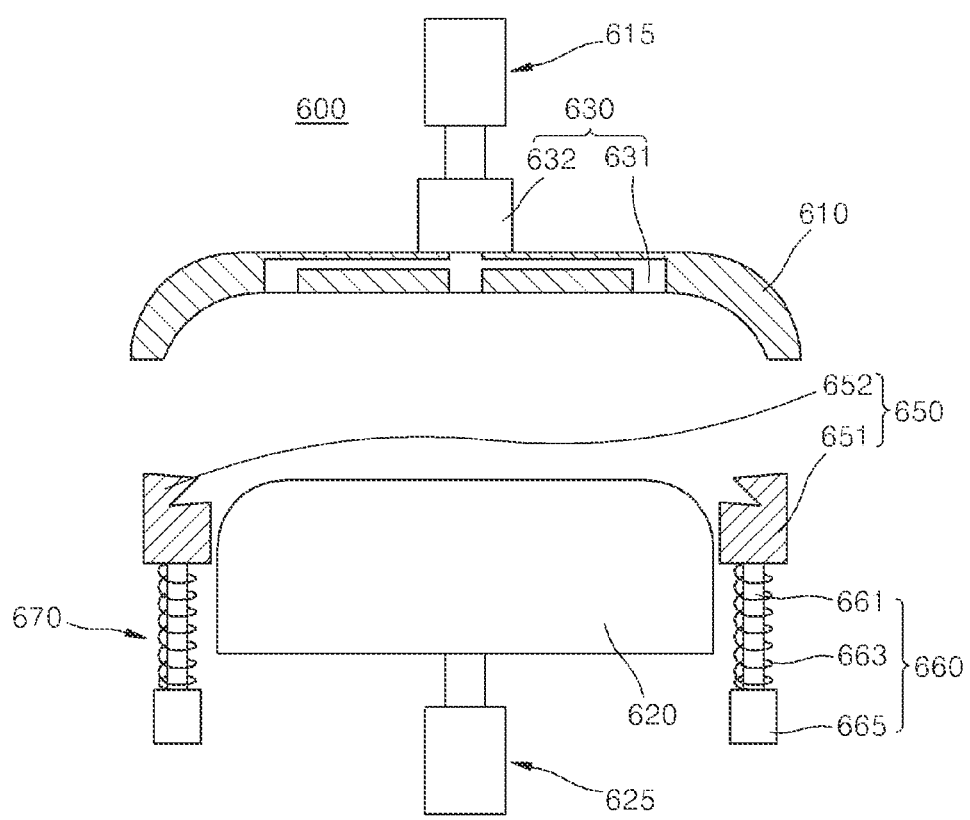
FIG. 10 is a cross-sectional view illustrating an apparatus for manufacturing the display device of FIG. 5 according to yet another embodiment of the present invention.
Figure 11:
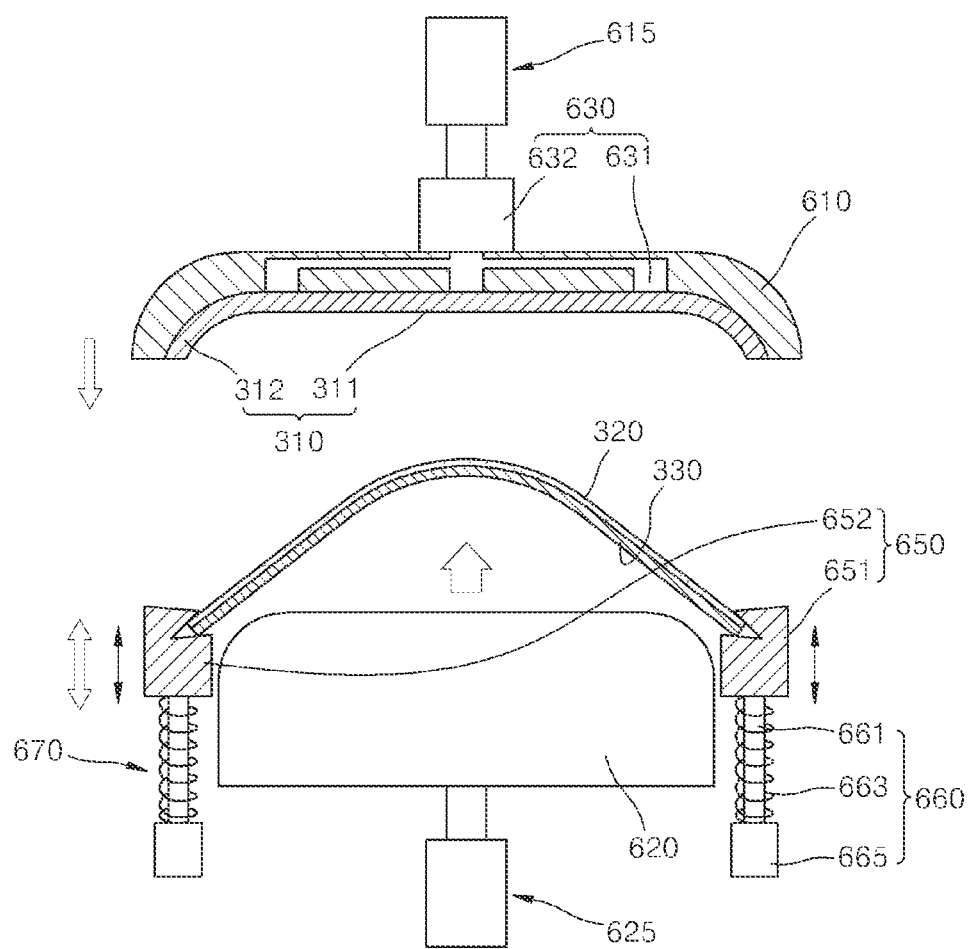
FIG. 11 is a cross-sectional view illustrating a method of manufacturing the display device of FIG. 5 according to yet another embodiment of the present invention.

FIG. 10 is a cross-sectional view illustrating an apparatus 600 for manufacturing the display device 300 of FIG. 5 according to yet another embodiment of the present invention. FIG. 11 is a cross-sectional view illustrating a method of manufacturing the display device 300 of FIG. 5 according to yet another embodiment of the present invention.

Referring to FIGS. 10 and 11, the apparatus 600 includes a first jig 610, a second jig 620, an actuator (including first actuator 615 and second actuator 625), a clamping unit 650, and a fixing unit (for example, first fixing unit 630). The first jig 610 and the second jig 620 may be substantially the same as those described above and thus, a detailed explanation thereof will not be repeated.

The actuator may include the first actuator 615 and the second actuator 625, and the fixing unit may include the first fixing unit 630. The first actuator 615, the second actuator 625, and the first fixing unit 630 may be substantially the same as those described above and thus, a detailed explanation thereof will not be repeated. The first fixing unit 630 may include a first absorption unit 631 and a first driving unit 632.

The clamping unit 650 may include a first clamping unit 651 and a second clamping unit 652. The first clamping unit 651 and the second clamping unit 652 may be substantially the same as those described above and thus, a detailed explanation thereof will not be repeated.

The apparatus 600 may include a first linear driving unit 660 and a second linear driving unit 670 which respectively vertically move the first clamping unit 651 and the second clamping unit 652 (for example, in a vertical direction with respect to gravity). The first linear driving unit 660 and the second linear driving unit 670 may be formed similarly and thus, the following explanation will focus on the first linear driving unit 660.

The first linear driving unit 660 may include a first shaft 661 that is connected to the first clamping unit 651 and linearly moves. In one embodiment, the first linear driving unit 660 may include a first driving module 665 that drives the first shaft 661. The first driving module 665 may include, for example, a cylinder or a motor. For convenience of explanation, however, it will be assumed that the first driving module 665 includes a motor. It will be further assumed that the first shaft 661 includes a ball screw that is lowered or raised as the first driving module 665 rotates.

The first linear driving unit 660 may include a first elastic unit 663 that surrounds the first shaft 661. The first elastic unit 663 may include a compression spring, and may be formed of an elastic material such as rubber. For convenience of explanation, however, it will be assumed that the first elastic unit 663 includes a compression spring. The first elastic unit 663 may surround an outer surface of the first shaft 661 as described above and thus may provide a restoring force to the first clamping unit 651 when the first clamping unit 651 moves.

A method of manufacturing the display device 300 by using the apparatus 600 will be described. The cover window 310 and the display panel 330 may be formed, and then the adhesive layer 320 may be formed on the display panel 330. Respective ends of the display panel 330 on which the adhesive layer 320 is formed may be fixed to the first clamping unit 651 and the second clamping unit 652. Once the display panel 330 is fixed to the first clamping unit 651 and the second clamping unit 652, middle portions of the display panel 330 and the adhesive layer 320 may be curved upward (for example, with respect to a gravity direction). In further detail, since an interval between the first clamping unit 651 and the second clamping unit 652 is less than a width of the display panel 330, the middle portions may protrude toward the first jig 610.

After the display panel 330 and the adhesive layer 320 are disposed in this manner, the display panel 330, the adhesive layer 320, and the cover window 310 may be compressed against one another by moving at least one of the first jig 610 or the second jig 620. For convenience of explanation, however, it will be assumed that the display panel 330, the adhesive layer 320, and the cover window 310 are compressed by moving both the first jig 610 and the second jig 620.

While the first jig 610 and the second jig 620 move in this manner, the first linear driving unit 660 and the second linear driving unit 670 may operate to vertically move the first clamping unit 651 and the second clamping unit 652. The first clamping unit 651 and the second clamping unit 652 may move at a speed similar to a speed at which the second jig 620 moves.

When the second jig 620, the first clamping unit 651, and the second clamping unit 652 are raised in this manner, the display panel 330 and the adhesive layer 320 may be raised while maintaining their curved states. When a distance between the first jig 610 and the second jig 620 reaches a set distance (for example, a predetermined distance), the first clamping unit 651 and the second clamping unit 652 may release from (for example, reduce their clamping force from) the display panel 330 and the adhesive layer 320. During or after this releasing of the first clamping unit 651 and the second clamping unit 652, the first linear driving unit 660 and the second linear driving unit 670 may lower the first clamping unit 651 and the second clamping unit 652.

Next, the first actuator 615 and the second actuator 625 may continuously operate to bring the first jig 610 and the second jig 620 closer (for example, adjacent) to each other (for example, the second jig 520 may contact the display panel 330). As the first jig 610 and the second jig 620 move closer, the display panel 330, the adhesive layer 320, and the cover window 310 may be compressed against one another. A method of compressing the display panel 330, the adhesive layer 320, and the cover window 310 may be performed in the same manner as that described above and thus, a detailed explanation thereof will not be repeated.

Accordingly, the method may rapidly and accurately manufacture the display device 300 having a curved shape. Further, the method may reduce or minimize a defect rate by accurately laminating the cover window 310 having a curved shape to the display panel 330. In addition, the method may improve product quality by removing air bubbles that may be generated after the display panel 330 and the curved portions 312 are compressed.

Figure 12:
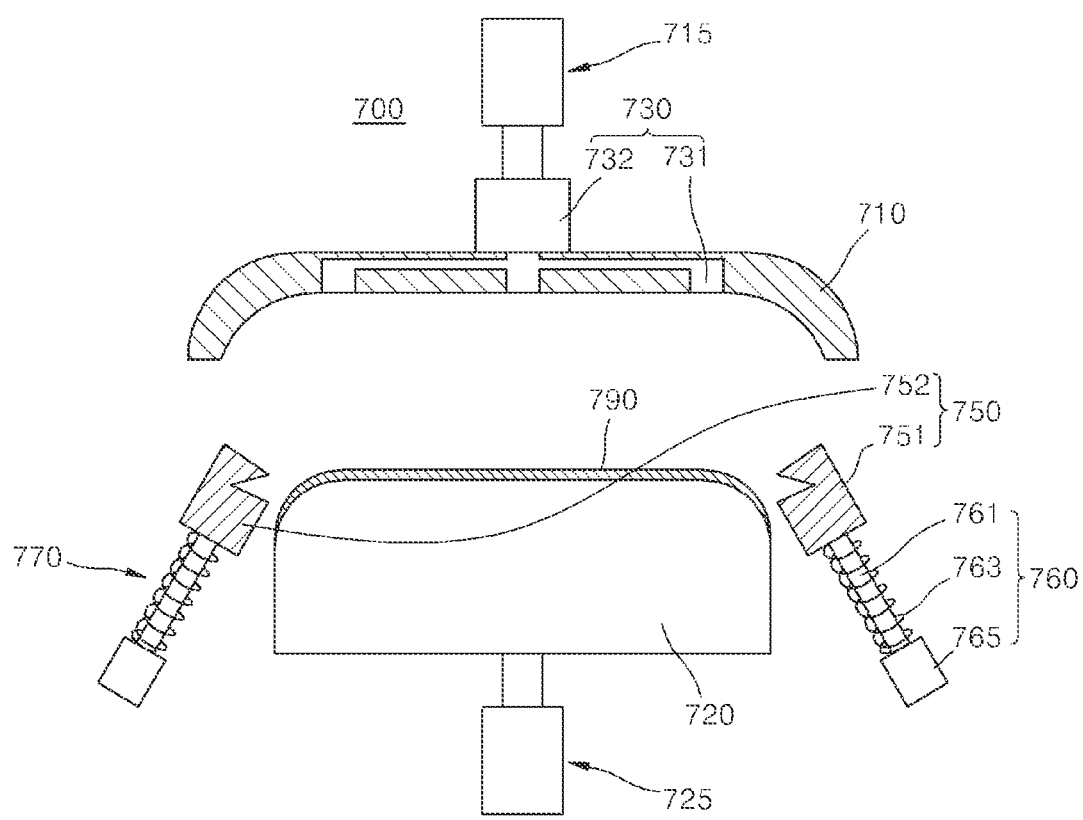
FIG. 12 is a cross-sectional view illustrating an apparatus for manufacturing the display device of FIG. 5 according to still yet another embodiment of the present invention.
Figure 13:
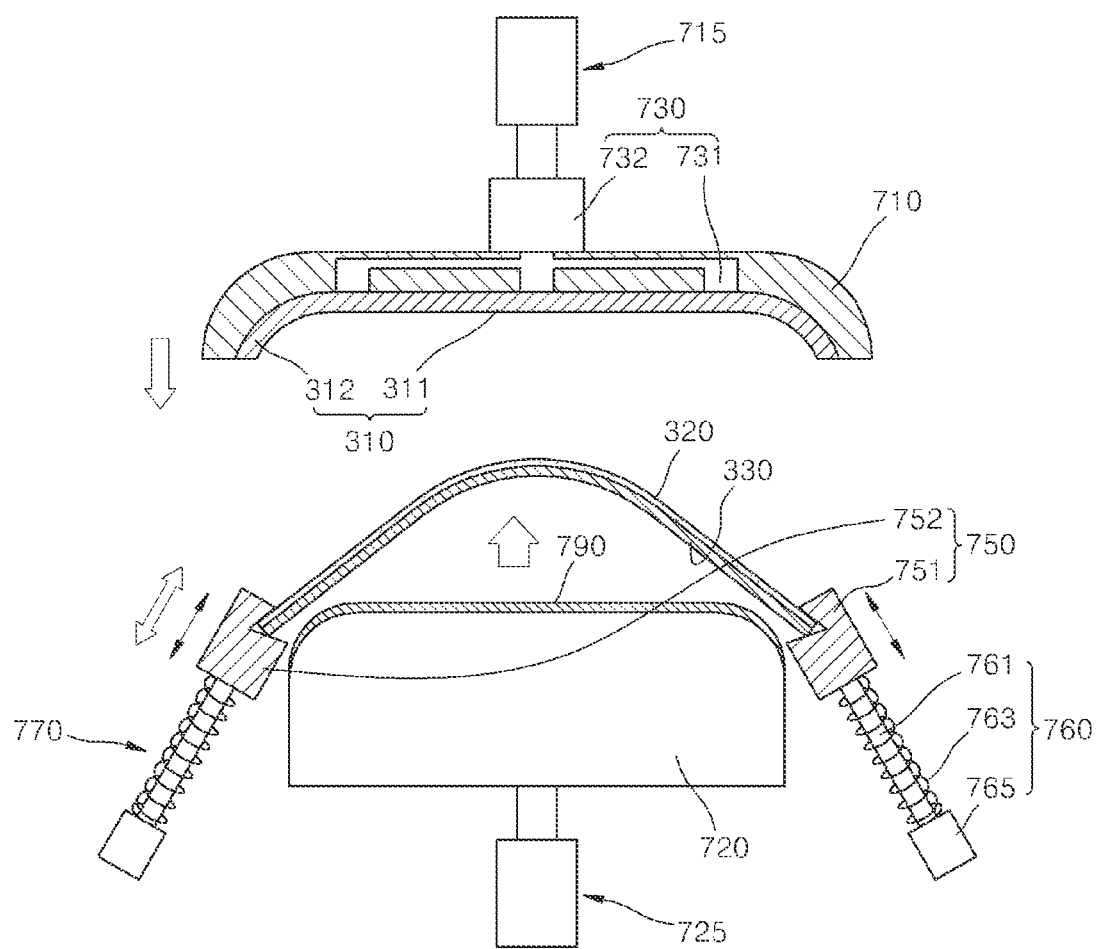
FIG. 13 is a cross-sectional view illustrating a method of manufacturing the display device of FIG. 5 according to still yet another embodiment of the present invention.

FIG. 12 is a cross-sectional view illustrating an apparatus 700 for manufacturing the display device 300 of FIG. 5 according to still yet another embodiment of the present invention. FIG. 13 is a cross-sectional view illustrating a method of manufacturing the display device 300 of FIG. 5 according to still yet another embodiment of the present invention.

Referring to FIGS. 12 and 13, the apparatus 700 may include a first jig 710, a second jig 720 (including a cushion unit 790), an actuator (including first actuator 715 and second actuator 725), a clamping unit 750 (including a first clamping unit 751 and a second clamping unit 752), a fixing unit (for example, first fixing unit 730), a first linear driving unit 760, and a second linear driving unit 770. The first jig 710 and the second jig 720 may be substantially the same as those described above and thus, a detailed explanation thereof will not be repeated.

The actuator may include the first actuator 715 and the second actuator 725, and the fixing unit may include the first fixing unit 730. The first actuator 715, the second actuator 725, and the first fixing unit 730 (which includes first absorption unit 731 and first driving unit 732) may be substantially the same as those described above and thus, a detailed explanation thereof will not be repeated.

The first linear driving unit 760 and the second linear driving unit 770 may linearly move the first clamping unit 751 and the second clamping unit 752, respectively. The first linear driving unit 760 and the second linear driving unit 770 may linearly move the first clamping unit 751 and the second clamping unit 752 in a diagonal direction, respectively, with respect to the second jig 720 (and, for example, with respect to a gravity direction). Since the second linear driving unit 770 may be formed similarly to the first linear driving unit 760, the following explanation will focus on the first linear driving unit 760.

In further detail, the first linear driving unit 760 may include a first shaft 761, a first driving module 765, and a first elastic unit 763. The first shaft 761, the first driving module 765, and the first elastic unit 763 may be formed in a similar manner to that described above (such as the first linear driving unit 660 in FIGS. 10-11) except that, the first shaft 761 is disposed in a diagonal direction to diagonally move the first clamping unit 751 with respect to the second jig 720.

When the first linear driving unit 760 operates, the first driving module 765 may vary a length of the first shaft 761. Since the first driving module 765 and the first shaft 761 are diagonally disposed with respect to the second jig 720 as described above, the first clamping unit 751 may be diagonally moved by varying the movement of the first shaft 761.

For example, when the first driving module 765 operates to diagonally move the first shaft 761 downward with respect to the second jig 720, the first clamping unit 751 may diagonally move downward with respect to the second jig 720 as the first shaft 761 moves. Likewise, when the first driving module 765 operates in an opposite direction to diagonally move the first shaft 761 upward with respect to the second jig 720, the first clamping unit 751 may diagonally move upward with respect to the second jig 720 as the first shaft 761 moves. The first shaft 761 may include a ball screw as described above and thus may rotate as the first driving module 765 operates. The first shaft 761 may diagonally move downward or upward with respect to the second jig 720 as the first driving module 765 rotates.

The cushion unit 790 may be formed in various ways. For example, the cushion unit 790 may be part of an outer surface (e.g., a contacting surface, such as a surface that contacts the cover window 310 or the display panel 330) of at least one of the first jig 710 or the second jig 720. In another embodiment, the cushion unit 790 may be part of a portion of such an outer surface of at least one of the first jig 710 or the second jig 720. In another embodiment, the cushion unit 790 is part of the apparatus 700 and covers such an outer surface of at least one of the first jig 710 or the second jig 720. For ease of description, it will be assumed that the cushion unit 790 is part of an entire such outer surface of the second jig 720.

A method of manufacturing the display device 300 may be similar to that described above. In further detail, the display panel 330 and the cover window 310 may be prepared, and then the adhesive layer 320 may be applied to the display panel 330. The display panel 330 to which the adhesive layer 320 is applied may be fixed by the first clamping unit 751 and the second clamping unit 752. When the fixing is completed, the display panel 330, the adhesive layer 320, and the cover window 310 may be compressed against one another by moving at least one of the first jig 710 or the second jig 720. A method of compressing the display panel 330, the adhesive layer 320, and the cover window 310 may be similar to that described above and thus, a detailed explanation thereof will not be repeated.

When the first jig 710 and the second jig 720 move in this manner, the first clamping unit 751 and the second clamping unit 752 may also move. The first clamping unit 751 and the second clamping unit 752 may be diagonally moved by the first linear driving unit 760 and the second linear driving unit 770, respectively. The first clamping unit 751 and the second clamping unit 752 may be raised diagonally with respect to the second jig 720.

When the first clamping unit 751 and the second clamping unit 752 are raised and then an interval between the first jig 710 and the second jig 720 reaches a preset interval, both ends of the display panel 330 may be released from the clamping unit 750. The display panel 330 may be laminated to the cover window 310 by the adhesive layer 320 beginning from a middle portion of the display panel 330.

During or after the releasing of the first clamping unit 751 and the second clamping unit 752 from the display panel 330, the first linear driving unit 760 and the second linear driving unit 770 may operate to lower the first clamping unit 751 and the second clamping unit 752. The first clamping unit 751 and the second clamping unit 752 may be lowered diagonally with respect to the second jig 720. While the first clamping unit 751 and the second clamping unit 752 are lowered, the first jig 710 and the second jig 720 may get closer to each other to compress the display panel 330, the adhesive layer 320, and the cover window 310 against one another. For example, the second jig 720 may contact the display panel 330. A method of adhering the display panel 330 and the cover window 310 through compression may be similar to that described above.

When the display panel 330 and the cover window 310 are compressed by using the first jig 710 and the second jig 720, the cushion unit 790 may spread a force applied to the display panel 330 and the cover window 310. In addition, the cushion unit 790 may help prevent the display panel 330 or the cover window 310 from being damaged by partially absorbing a force applied to the display panel 330 and the cover window 310.

Accordingly, the method may rapidly and accurately manufacture the display device 300. Further, the method may reduce or minimize a defect rate by accurately laminating the cover window 310 having a curved surface to the display panel 330. In addition, the method may improve product quality by removing air bubbles that may be generated after the display panel 330 and the curved portions 312 are compressed.

This application relates in general to a display device and more particularly, to a display device and a corresponding method and apparatus for manufacturing the display device that may rapidly, accurately, and cleanly manufacture the display device having a curved shape. Small electronic devices having curved display devices have presented challenges in accurately forming and aligning their corresponding cover windows (for example, transparent protective covers) and display panels (such as OLED display panels or flexible OLED display panels), and adhering the cover windows to the display panels via transparent adhesive without quality defects such as air bubbles between the cover windows and the display panels.

Embodiments of the present invention address these problems by providing a display device having a curved cover window, a display panel that fits in the cover window, and an adhesive layer between the display device and the cover window, together with an apparatus and method for manufacturing the display device. The cover window is fabricated with a curved shape (such as rounded edges) and mounted to a first jig having a mount surface that conforms to the cover window. For example, the cover window may sit in the first jig (through gravity) or attach to the first jig via a fixing unit, such as a vacuum suction device. Meanwhile, the display panel (to which the adhesive layer is attached), is attached to a second jig by similar means. The distance between the jigs is then closed (by moving one or both jigs towards the other using, for example, actuators), allowing the display panel to press up to the cover window and adhere via the adhesive layer, and without forming air bubbles between the cover window and the display panel.

In another embodiment, the display panel may be attached to a clamp unit, such as a pair of clamps, and bent through a clamping force to mate cleanly with the cover window when the jigs are moved towards each other. The clamps may be moved via dedicated driving units (for example, which drive ball screws through rotational movement to move the clamps) independently of the jigs, and may move, for example vertically or diagonally with respect to the jigs (and with respect to a gravity direction).

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A display device comprising:
   a cover window comprising a curved portion and a flat portion; and
   a display panel comprising:
   a substrate;
      a light-emitting unit on the substrate and comprising an organic light emitting device; and
      a thin film on the light-emitting unit, the thin film comprising an organic layer and an inorganic layer,
   wherein the display panel is smaller in at least one of length or width than the cover window, is on the flat portion of the cover window, and defines:
   a first display panel portion on the flat portion; and
      a second display panel portion extending in a curved shape from the first display panel portion and on the curved portion.

2. The display device of claim 1, further comprising an adhesive layer between the first display panel portion and the cover window, and between the second display panel portion and the cover window.

3. The display device of claim 1, wherein the display panel is flexible.

4. The display device of claim 1, wherein the curved portion comprises a plurality of curved portions.

5. A display device comprising:
   a cover window comprising a curved portion and a flat portion; and
   a display panel comprising:
   a substrate;
      a light-emitting unit on the substrate and comprising an organic light emitting device; and
      a thin film on the light-emitting unit, the thin film comprising an organic layer and an inorganic layer,
   wherein the display panel is smaller in at least one of length or width than the cover window and is entirely on the flat portion of the cover window.

\* \* \* \* \*